United States Patent [19]
Su et al.

[11] Patent Number: 5,344,815
[45] Date of Patent: * Sep. 6, 1994

[54] FABRICATION OF HIGH $T_C$ SUPERCONDUCTING HELICAL RESONATOR COILS

[75] Inventors: Sophia R. Su, Weston; Margaret O'Connor, Worcester; Scott Butler, N. Oxford, all of Mass.

[73] Assignee: GTE Laboratories Incorporated, Waltham, Mass.

[*] Notice: The portion of the term of this patent subsequent to Feb. 22, 2011 has been disclaimed.

[21] Appl. No.: 875,905

[22] Filed: Apr. 29, 1992

Related U.S. Application Data

[63] Continuation-in-part of Ser. No. 797,874, Nov. 26, 1991, which is a continuation-in-part of Ser. No. 745,819, Aug. 16, 1991.

[51] Int. Cl.$^5$ .................................... H01L 39/12
[52] U.S. Cl. ........................... 505/1; 264/63; 264/65; 264/66; 264/211; 264/211.11; 264/211.12; 264/211.13; 264/235; 505/739; 505/740; 505/748; 505/705
[58] Field of Search ................ 264/63, 65, 66, 210.1, 264/210.6, 211.11, 211.12, 211.13, 211, 235; 505/1, 739, 740, 742, 705

[56] References Cited

U.S. PATENT DOCUMENTS

| | | | |
|---|---|---|---|
| 4,424,179 | 1/1984 | Minjolle et al. | 264/63 |
| 4,677,082 | 6/1987 | Alford et al. | 501/881 |
| 4,990,493 | 2/1991 | Lay | 505/1 |
| 5,011,823 | 4/1991 | Jin et al. | 505/740 |
| 5,037,801 | 8/1991 | Kloucek | 505/740 |
| 5,039,658 | 8/1991 | Hsu | 505/740 |
| 5,100,864 | 3/1992 | Hsu | 505/740 |
| 5,106,826 | 4/1992 | Alford et al. | 505/1 |

FOREIGN PATENT DOCUMENTS 0183453  6/1986  European Pat. Off. ..... C04B 35/00

OTHER PUBLICATIONS

Dorris et al. "Extrusion of Multilayer Superconductor Coils" ACS Bulletin vol. 70, No. 4, pp. 722–726 Apr. 1991.

(List continued on next page.)

*Primary Examiner*—Jan H. Silbaugh
*Assistant Examiner*—Christopher A. Fiorilla
*Attorney, Agent, or Firm*—Lawrence E. Monks

[57] ABSTRACT

A method for producing a superconducting copper oxide based helical resonator coil exhibiting improved quality factor, Q. A copper oxide based superconductor powder is mixed with a binder melt at about 45–65% solids by volume. The binder is an RCOOR' ester wax with R and R' each a long chain hydrocarbon group of at least 6 carbons. The ester wax has a melting point of about 40°–100° C. and a viscosity of about 94–2000 centipoise at its melting point. The binder/powder mixture is extruded and wrapped around a mandrel to form a helical coil. The coil is embedded in a setter powder and heated in an oxidizing atmosphere at up to about 2° C./min to about 450°–650° C., and held for a time sufficient to remove the binder. The coil is then heated in the oxidizing atmosphere at up to about 3° C./min to at least about 920° C., and held at about 920°–990° C. for a time sufficient to achieve a density of at least about 93% of theoretical density. The densified coil is cooled in the oxidizing atmosphere at below about 2° C./min to at or below about 550° C., and annealed at about 450–550° C. in flowing oxygen for a time sufficient to convert the crystal structure of the coil to at least 50 v/o high $T_c$ phase superconducting perovskite crystal. The geometry of the extruded, wrapped helical coil is selected to produce, after subsequent densification, a helical resonator coil about 3–17 mm in inner diameter, of a total length n λ/2, wherein n is an integer and λ is the operating wavelength of the helical resonator coil.

18 Claims, 4 Drawing Sheets

OTHER PUBLICATIONS

A. B. Carlson, *Communication Systems, An Introduction to Signals and Noise in Electrical Communication*, p. 8, McGraw-Hill, N.Y., 1986.

O. P. Gandhi, *Microwave Engineering and Applications*, p. 1, Pergamon Press, N.Y., 1981.

S. R. Su et al., "Correlation of Microwave and Superconducting Properties of $YBa_2Cu_3O_{7-x}$ Wires and Helical Coils", Posters, MRS Spring Meeting, Anaheim, Calif., Apr. 29–May 4, 1991.

S. R. Su et al., "Microwave Properties of $YBa_2Cu_3O_{7-x}$ Helical Resonators", Abstract, IEEE MTT-S International Microwave Symposium, Boston, Mass., Jun. 14, 1991.

S. R. Su et al., "Surface Resistance of Grain-Aligned Superconducting $YBa_2Cu_3O_{7-x}$ Bulk Materials-Wires and Helical Coils", Abstract, MRS Fall Meeting, Boston, Mass., Dec. 2–6, 1991.

FABRICATION OF HIGH $T_C$ SUPERCONDUCTING HELICAL RESONATOR COILS

CROSS REFERENCE TO RELATED APPLICATIONS

This application is a continuation-in-part of commonly assigned, copending U.S. patent application Ser. No. 07/797,874, filed Nov. 26, 1991, which is a continuation-in-part of commonly assigned, copending U.S. patent application Ser. No. 07/745,819, filed Aug. 16, 1991. Application Ser. Nos. 07/797,874 and 07/745,819 are incorporated herein by reference.

FIELD OF THE INVENTION

This invention relates to the fabrication of high temperature ceramic superconducting materials and, in particular, to a process for producing high quality helical resonator coils of copper oxide based superconducting materials.

BACKGROUND OF THE INVENTION

Resonators are critical components in microwave and radio frequency circuits. As used herein, these frequencies include HF, defined as 100–10 m (about 3–30 MHz); VHF, defined as 10–1 m (about 30–300 MHz); UHF, defined as 1 m–10 cm (about 300 MHz to about 3 GHz); and microwave, defined as about 300 MHz to about 300 GHz. (See, e.g., A. B. Carlson, *Communication Systems, An Introduction to Signals and Noise in Electrical Communication*, p. 8, McGraw-Hill, N.Y., 1986; O. P. Gandhi, *Microwave Engineering and Applications*, p. 1, Pergamon Press, N.Y., 1981.) One of the many types of resonators is a helical resonator, i.e. a cavity resonator consisting of a helical coil in a shield. A helical resonator operates as a slow-wave transmission line with a relatively high characteristic impedance. In practice, a helical resonator is preferred as the resonance element in bandpass and bandrejection filters of a center frequency from several tens of MHz to about 2 GHz. They are used extensively as preselection filters in receivers, as interstage filters in IF amplifiers and as resonant elements in oscillators. Additionally, they have been simple to fabricate from metals, have good quality factors ("Q"), are relatively small in size, and exhibit high sensitivity (i.e., high signal-to-noise ratio).

The small size and compact shape of such helical resonators can be significant advantages in some applications. For example, their compact size and high Q qualify these resonators to serve as bandpass filters operating at 1 GHz in mobile communications systems. Mobile radios, satellites, and cellular telephones have very tight specifications on adjacent channel noise performance. As channel spacings get closer together, further improvement in performance is required to reduce interference and noise level between adjacent channels. In principle, a high Q bandpass filter including high $T_c$ superconducting helical resonator coils should outperform those that use metal coils.

Two intrinsic properties of superconducting materials, low surface resistance and frequency-independent penetration depth, make high critical temperature ($T_c$) oxides potentially ideal materials for passive microwave devices. Low surface resistance should correspond to low loss and higher quality factor, "Q", in microwave system components. A frequency-independent penetration depth means that ceramic superconductors, in theory, should introduce no dispersion into a microwave device even at very high frequencies. Consequently, existing circuits should be improved by replacing the usual metal coils with low loss, high $T_c$ superconducting ceramic coils. Resulting devices should have less insertion loss, high Q, and much smaller circuits.

However, the dielectrics of substrates and geometry of devices may still produce losses. In reality the quality of superconducting materials dominates the performance of passive microwave devices. Recently, high $T_c$ materials of microwave quality in the form of thin films epitaxially grown on low dielectric loss substrates have been developed that lessen or eliminate such dielectric and geometric losses. Numerous research activities are being pursued to take advantage of the properties of such newly developed high $T_c$ materials. Development of such thin film devices has advanced much further than that of helical devices, at least in part because high quality films are more easily produced than high quality bulk materials. The operating properties, for example the surface resistance, $R_s$, of helical resonator coils and their microwave penetration depth, $\lambda$, appear to be related to the quality of the coil materials.

European Patent Application No. 183453 describes production of helical resonators using a bulk $YBa_2Cu_3O_{7-x}$ fabricated by a viscous processing method. These resonators, which operate at 77K and cover the frequency range from 0.1 to 2.0 GHz, outperform their copper counterparts by a factor of 5 in unloaded Q. ($1/Q_u = 1/Q_l + 1/Q_c$, where $Q_u$ is unloaded Q, $Q_l$ is loaded Q, and $Q_c$ is the Q of the copper shield.) In the process described in EP 183453, the powder is mixed with a viscous polymer solution at a solids fraction of 0.52. The resulting mixture is processed on a two roll mill until a homogeneous mixture forms. Wires or rods are shaped by extrusion through a series of dies ranging from 0.2–4 mm diameter, and are dried at 80° C. The binder is removed and the wires are densified.

The process described in EP 183453 involves many steps, and elaborate precautions must be taken to prevent cracking during the drying step. As a result, this process is time consuming and is impractical for large scale production. It would be advantageous to find a more reliable and efficient process for producing high $T_c$ superconducting ceramic helical resonator coils.

SUMMARY OF THE INVENTION

A method for producing a superconducting copper oxide based helical resonator coil exhibiting improved quality factor, Q, involves mixing a copper oxide based superconductor as a powder and a binder as a melt at a solids loading of about 45–65% by volume to form a homogeneous extrudable powder/binder mixture. The binder consists essentially of an ester wax with no more than about 0.25 weight percent extrusion-aiding additives. The ester wax has the general formula RCOOR' with said R and said R' each being independently selected from the group consisting of long chain hydrocarbon groups of at least 6 carbons, and has a melting point of about 40°–100° C. and a viscosity of about 94–2000 centipoise at its melting point. The binder/powder mixture is extruded to form an as-extruded wire about 800 μm to about 2 mm in diameter. Simultaneously with the extruding step, the as-extruded wire is wrapped around a cylindrical mandrel to form an extruded helical coil. The extruded coil is removed from said mandrel. The extruded coil, while embedded in a setter powder, is heated in an oxidizing atmosphere at a heating rate of up to about 2° C./min to a binder removal temperature of about 450°-650° C., and held in the oxidizing atmosphere at the binder removal temperature for a time sufficient to remove the binder from the extruded coil and to form a green coil having a density of at least 50% of theoretical density. The setter powder is selected to avoid contamination of the green coil. The green coil is heated in the oxidizing atmosphere at a heating rate of up to about 3° C./min to a sintering temperature of at least about 920° C., and held in the oxidizing atmosphere at a temperature of about 920°-990° C. for a time sufficient to densify the green coil to a density of at least about 93% of theoretical density. The densified coil is cooled in the oxidizing atmosphere at a rate below about 2° C./min to a cooled temperature at or below about 550° C. The cooled coil is held at an annealing temperature of about 450°-550° C. in an atmosphere of flowing oxygen for a time sufficient to convert the crystal structure of the cooled coil to at least 50 v/o high $T_c$ phase superconducting perovskite crystal. The extruded helical coil produced by the extruding and wrapping steps is of a geometry selected to produce, after subsequent densification, a helical resonator coil about 3-17 mm in inner diameter, of a total length n $\lambda/2$, wherein n is an integer and $\lambda$ is the operating wavelength of the helical resonator coil.

In a narrower aspect, the step of heating the green coil to the sintering temperature involves heating the green coil in the oxidizing atmosphere at a heating rate of up to about 3° C./min to about the incongruent melting temperature of the superconductor, and holding the green coil in the oxidizing atmosphere at about the incongruent melting temperature for a time just sufficient to begin partial melting of at least one component in the superconductor. The partially melted coil is then cooled in the oxidizing atmosphere at a rate below about 4° C./min to a consolidation temperature of about 940°-969° C., and held in the oxidizing atmosphere at the consolidation temperature for a time sufficient to consolidate the coil to a density of at least 90% of theoretical density and sufficient to achieve an average grain length of at least about 0.3 mm and grain alignment along the length of the wire. The coil is then further cooled as described above.

BRIEF DESCRIPTION OF THE DRAWINGS

For a better understanding of the present invention, together with other objects, advantages and capabilities thereof, reference is made to the following Description and appended claims, together with the Drawings, in which:

DETAILED DESCRIPTION OF THE PREFERRED EMBODIMENTS

Described herein is a one-step shaping process using plastic extrusion to produce superconducting helical coils of precise dimensions. By this process, large quantities of superconducting helical coils of high microwave quality, Q, may be produced. The critical temperature, $T_c$, at which zero resistance occurs in these superconducting coils is high, e.g. about 90K for an $YBa_2Cu_3O_{7-x}$ (YBCO) coil having a density of 95% of theoretical density (based on a theoretical density for YBCO of 6.38 g/cm$^3$). The Q value of the helical resonators made of these coils is higher than that of their copper counterparts. For example, the Q value for a typical high quality YBCO coil fabricated as described herein is higher than that of a typical copper coil by a factor of at least five at resonance frequencies near 1 GHz (i.e. about 800 MHz-1.2 GHz) and at 77K, and at least 10 times higher than one commercially available copper coil at resonance frequencies of about 100-500 MHz at 77K. The surface resistance, $R_s$, of the best YBCO coil fabricated by the process described herein was ⅛th that of a similar, typical copper coil.

The process involves mixing a superconducting powder with an organic binder at the melting temperature of the binder, typically about 90° C., and extruding the mixture through a die with a desired diameter to produce a wire. The as-extruded wire is wound directly onto a mandrel to fabricate a helix-shaped coil. The organic binder is removed from the wound helix by firing in a supporting setter powder bed. The binder-free green coil is then sintered to at least about 93%, preferably at least about 95%, and most preferably about 98% of theoretical density, then annealed in oxygen to optimize the superconducting phase. This process produces very high quality helical coils with superior microwave properties.

Figure 1:
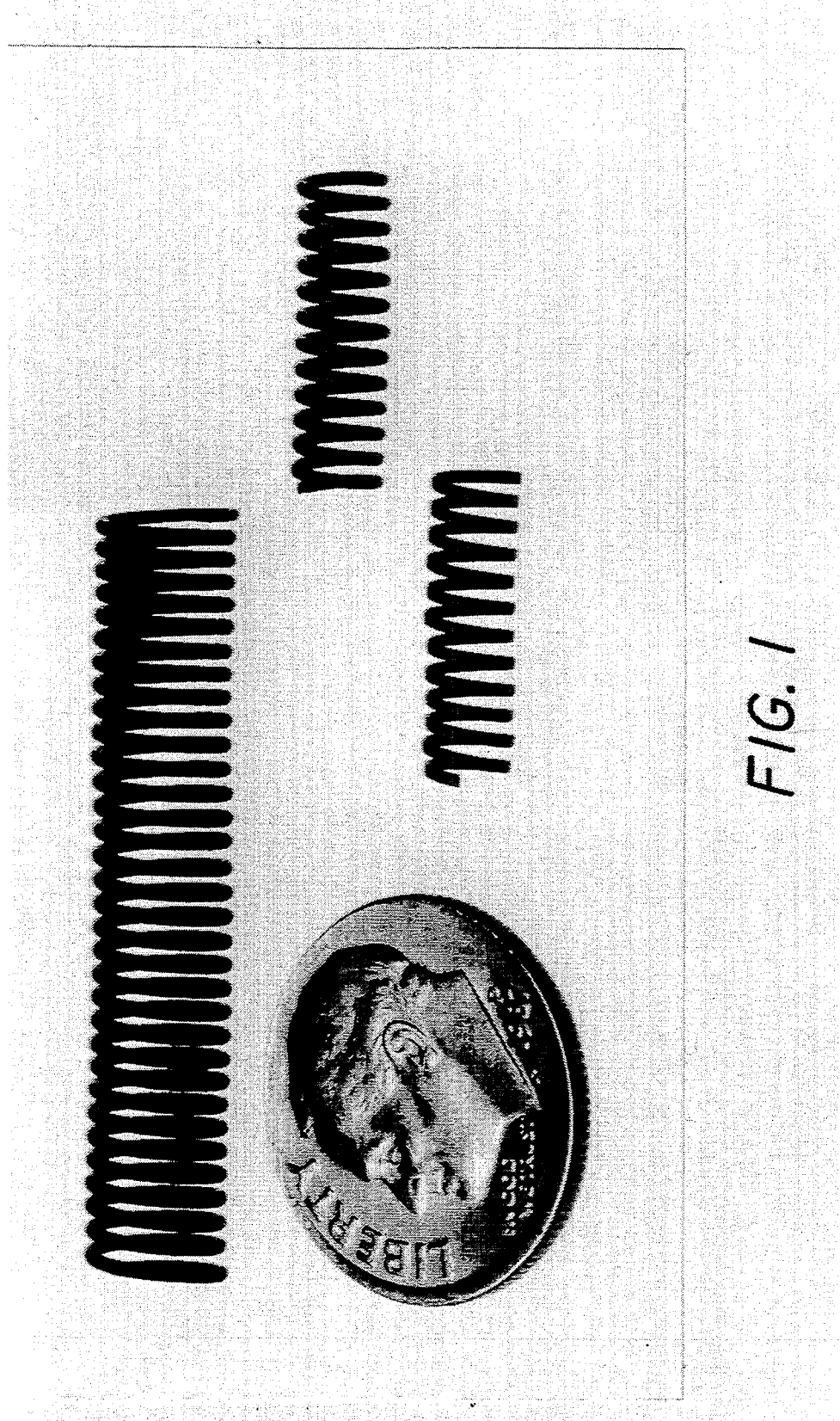
FIG. 1 is a photomicrograph showing sintered superconducting helical resonator coils fabricated by a process in accordance with one embodiment of the invention.

The process is described herein principally with reference to helical resonator coils formed from exemplary yttrium barium copper oxide superconducting materials, referred to herein as $YBa_2Cu_3O_{7-x}$ or YBCO. However, the described process applies as well to any rare earth barium copper oxide, referred to herein as $(RE)Ba_2Cu_3O_{7-x}$ or REBCO, as well as to any bismuth containing copper oxide material, with or without lead doping, for example $(Bi,pb)_2Sr_2CaCu_2O_x$ or $(Bi,Pb)_2Sr_2Ca_2Cu_3O_x$ (both referred to herein as (Bi,Pb)-Sr-Ca-Cu-O), or $Bi_2Sr_2CaCu_2O_x$ or $Bi_2Sr_2Ca_2Cu_3O_x$ (both referred to herein as Bi-Sr-Ca-Cu-O). That is, the process is suitable for forming helical resonator coils from any ceramic superconducting material which can be made electrically conductive without resistance at temperatures above about 70K in a manner similar to the above mentioned REBCO, Bi-Sr-Ca-Cu-O, and (Bi,Pb)-Sr-Ca-Cu-O compounds. Exemplary coils of such materials are shown in FIG. 1. FIG. 1 is a photomicrograph of typical sintered and annealed YBCO resonator coils prepared in accordance with one aspect of the process described herein.

The first step in the process is the compounding of the powder/binder mixture. As mentioned above, any rare earth barium copper oxide or bismuth containing copper oxide material which can be made electrically conductive without resistance at temperatures above about 70K is suitable for the superconducting powder component of the powder/binder mixture. The term "RE" in the nominal formulas used herein is intended to include the rare earth elements, typically yttrium, lanthanum, neodymium, samarium, europium, gadolinium, dysprosium, holmium, erbium, ytterbium, and lutetium. Examples of such suitable powders are superconducting $YBa_2Cu_3O_{7-x}$ powders. Suitable bismuth containing copper oxide powders include those also containing strontium and calcium and, optionally, lead in a so-called 2212 or 2223 formulation (a 2:2:1:2 or 2:2:2:3 ratio of Bi:Sr:Ca:Cu or (Bi,Pb):Sr:Ca:Cu in the starting formulation). The 2223 formulation is the higher $T_c$ phase: $T_c$=110K. Powders produced by any method are acceptable, as long as they meet the above-described criteria.

The superconducting powder is dispersed into a selected binder system which can provide adequate rheological properties, in terms of chemical compatibility and dispersibility, for the extruding step described herein. The rheological properties obtained with the binder system described in detail below include (a) a high concentration of solids (powder) loading for high green density and (b) a high surface compatibility between powders and binder for deflocculation of the particles, uniform dispersibility, and homogeneous green microstructure.

The preferred ester wax binder system is described in detail in above-referenced application Ser. No. 07/797,874. Binders suitable for the process described herein are ester waxes having melting points of about 40°–100° C., viscosities at the selected melting temperature of about 94–2000 centipoise, and the general formula RCOOR' with R and R' each being an aliphatic hydrocarbon chain of at least about 6 carbons. Preferred are binders which have no significant, i.e. below about 1 w/o (weight percent), residual carbonaceous material after burnout in an inert atmosphere such as nitrogen or argon. Also preferred are binders which exhibit a wide thermal decomposition range, e.g. at least 300° C., to avoid exothermic reactions which can cause cracking during the binder removal process. Examples of such suitable ester waxes are Ester Wax RT and Ester Wax E, manufactured by Hoechst Celanese. Ester Wax RT has a density of about 0.95–0.98 g/ml, decomposes at about 200°–550° C., and has aliphatic hydrocarbon terminal chains of at least 6 carbons; Ester Wax E has a density of about 1.01–1.03 g/ml, decomposes at about 250°–600° C., and also has aliphatic hydrocarbon terminal chains of at least 6 carbons. These ester waxes have melting points of about 77°–83° C., viscosity at the melting temperature of about 94 centipoise, and are completely removable from the shaped coils without significant residue by heating in air to moderate temperatures. Ester Wax RT leaves a residue of about 0.26 w/o after heating to 600° C. at 10° C./min in flowing nitrogen; Ester Wax E, about 0.5 w/o. This residual carbon is totally removed after burnout in air. The decomposition ranges and residues may be accurately measured by thermogravimetric analysis (TGA) of the ester wax. For a die size of less than about 0.4 mm and/or for the above-described bismuth containing copper oxide based powders, a trace amount of oleic acid of no more than about 1.0 weight percent may be added to the ester wax of the binder to facilitate extrusion through the capillary die. However, for larger die sizes, the ester wax alone is sufficient for a YBCO powder.

The above-described ester waxes contribute several valuable properties to the extrudable mixture. For example, the polar nature of, e.g., a YBCO superconducting compound can result in problems in dispersing the powder in a binder. The described ester waxes serve to disperse the powder by weak electrostatic force. The carbonyl group (C=O) linking the ester's long hydrocarbon side chains (R and R') is responsible for the binding of the wax to surface oxygen atoms of the superconducting oxides through the formation of hydrogen bonds. Therefore, better dispersibility results. The long hydrocarbon chains also act as lubricants, leading to higher packing densities of the powder. Also, the low carbon residue after binder removal prevents the lowering of the critical current density that can occur in the superconducting product when incomplete binder removal results in a high level of residual impurities.

The ester waxes also exhibit advantageous physical properties. The selected soft wax binders cause far less microstructural cracking during binder burnout than, e.g., prior art hard paraffin wax binders. Such cracking seriously detracts from the superconducting properties achievable in the superconducting product. As described above, the melting points of these ester waxes are in the range of about 77°–83° C., the viscosities are about 94 centipoise, and the densities are about 0.95–1.03 g/ml. Because of the superior properties of the described ester waxes, generally no additional plasticizer, dispersant, or solvent is needed for mixing. For example, a small batch (5 to 40 grams) of powder can be easily mixed with the binder wax in a beaker with a stirring rod on a hot plate. Alternatively, a commercially available compounder, e.g. a Haake compounder with a sigma blade, may be used for a larger batch, e.g. above about 100 grams. Typically, the ester wax is heated before and/or during mixing to melt the wax. In some situations, heat created by friction during the mixing process itself may be sufficient to melt the wax. Melting of the wax is generally advisable because of the high powder concentration in the mixtures. In some situations, e.g. with the above-described bismuth containing copper oxide based powders and/or when using an extruder die less than about 0.4 mm in diameter, additions to the binder system of small amounts of dispersants or surfactants may be desirable. For example, 0.15 g oleic acid may be added as a lubricant to a mixture including 10 g of a bismuth containing copper oxide based powder.

Thorough mixing, to ensure a constant powder concentration throughout the product coil, aids in achievement of precise dimensions in the sintered helical coils. The rheological properties, e.g. solids fraction, of the mixture should preferably be adequate for producing a helix with an inner diameter, I.D., as small as 3.2 mm. A mixture with too high a solids fraction can lead to coils with uneven I.D. because of low flexibility. A mixture with a too low solids fraction can provide uneven shrinkage during sintering, resulting in deformed coils. A suitable solids loading for good rheological properties may be readily determined by empirical methods. A solids loading of about 59–66 v/o (volume percent), typically about 64 v/o, was found to be suitable for the coils described herein. The solids fraction of the high $T_c$ powder in the mixture may be characterized by TGA.

The mixing and extrusion of this powder/binder mixture may be performed using laboratory equipment or commercially available apparatus. For example, smaller samples, e.g. about 10–40 grams, have been mixed in a beaker, as described above, then extruded using a pneumatically pumped syringe held in an alumina heating oven, the syringe having a capillary die selected to produce the desired wire diameter, e.g. 200 μm–2 mm. Samples above about 100 grams have been processed in a Rheomix Model 400 or 600 mixer available from Fisons Instrument (Valencia, Calif.), which can also serve as an extruder for shaping a wire to form the helical coil. These extrusion systems are only presented as examples; other extrusion systems may be used, and other heating means may be utilized, if needed.

Figure 2:
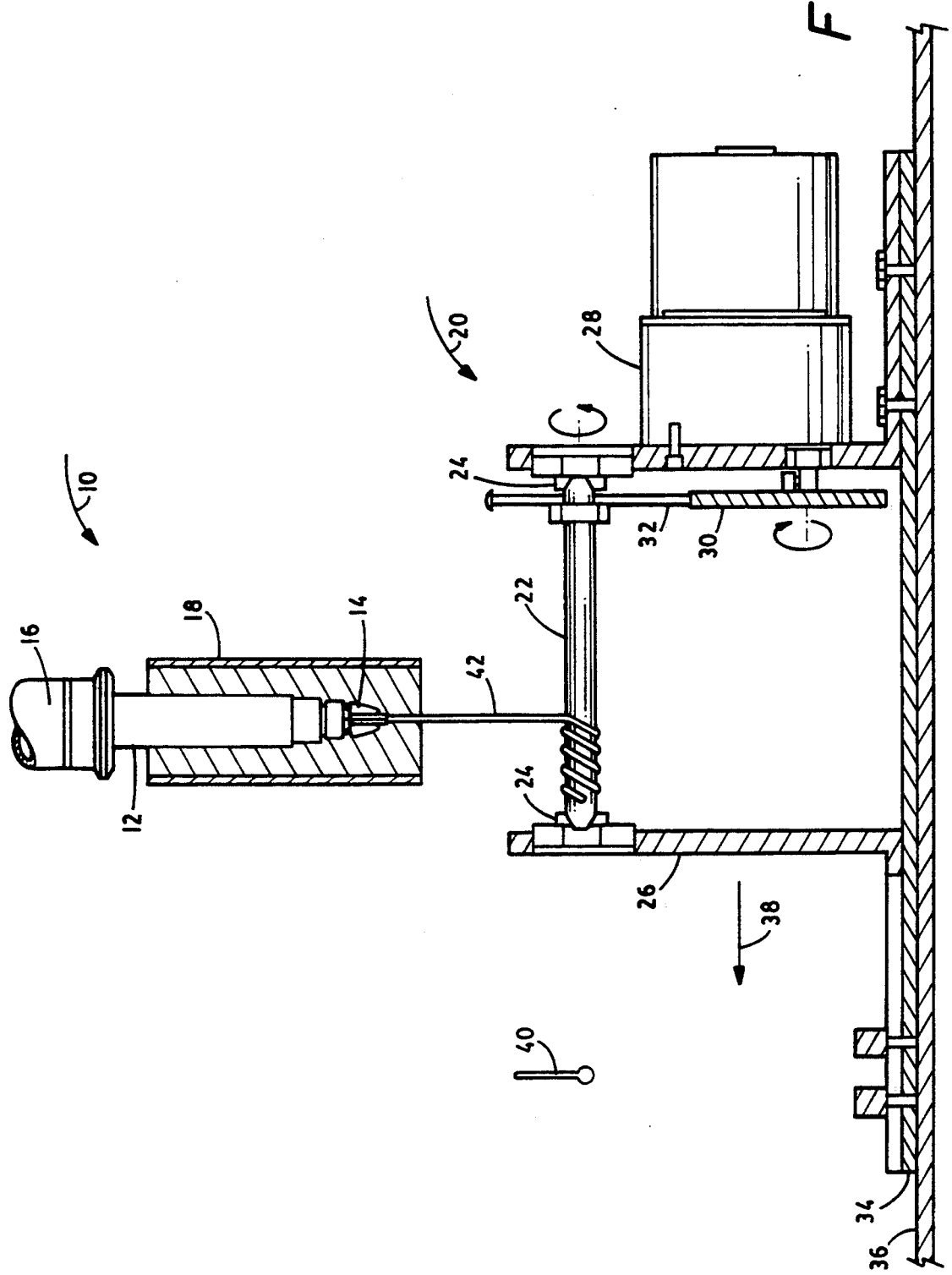
FIG. 2 is a schematic elevational view of a typical apparatus for carrying out the extrusion and shaping steps of the process in accordance with one embodiment of the invention.

Extruded helical coils of the desired I.D., and length may be fabricated by extrusion of a wire, as described above, simultaneously with the wrapping of the as-extruded wire around a mandrel, as shown in FIG. 2. The system shown in FIG. 2 uses a combination of a syringe extruder and a rotating, transversely moving mandrel to shape the coil. Extruder 10 includes syringe 12 positioned with its axis in a vertical position. Syringe 12 is capped by extruder die 14 and is pumped by pneumatic pump 16. Syringe 12 and die 14 are surrounded by heating means 18, which may be an oven surrounded by a foil heater or other suitable heating means known in the art. Mandrel unit 20 includes replaceable mandrel 22 positioned directly below die 14. Mandrel 22 rotates within bearings 24 in frame 26 at a speed controlled by motor 28 through drive gear 30 and split hub spur gear 32. Mandrel unit 20 is fixedly mounted on speed controlled transversal platform 34, which rests on stationary platform 36 in sliding relation thereto.

In operation, a drive means (not shown) moves transversal platform 34 at a controlled speed across fixed platform 36 in a direction, shown by arrow 38, parallel to the axis of mandrel 22, until frame 26 meets stop 40. Simultaneously with (a) the controlled transverse motion of mandrel unit 20, (b) pneumatic pump 16 creates a controlled pressure level within syringe 12 causing extrusion of wire 42 directly above mandrel 22, and (c) motor 28 and gears 30 and 32 cause mandrel 22 to rotate at a controlled rate. Mandrel 22 may, if desired, be one of a set of mandrels of varying diameters and lengths, with frame 26 and bearings 24 designed to accommodate any one of the mandrels of the set. By coordinating the extrusion rate (pneumatic pressure level) and die diameter of syringe 12, the diameter and rotational speed of mandrel 22, and the transversal speed of platform 34, coils with the desired geometry may be fabricated.

Typical approximate dimensions of helical coils shaped as described herein are: wire diameter=200 μm–2 mm, helix ID=3–17 mm, helix pitch (distance between coil windings)=2–4 mm, helix length=12–165 cm. The final dimensions of the sintered helical resonator coil are largely determined by these simultaneous extruding and wire wrapping steps. The wire diameter is controlled by the size of the extruder die and by the percent shrinkage during sintering (a function of the solids loading). The helix pitch is determined by the mandrel rotation rate and the transversal speed of the platform. The helix ID is controlled by the mandrel diameter and to some degree by sintering shrinkage (as mentioned above, a function of the solids loading). The helix length is determined by the capacity of the syringe and by the length of the mandrel and how much of that length is utilized. Although coils formed from extruded wires of circular cross-section are described herein, wires may also be extruded as tapes with oval, rectangular, or other cross-sections for shaping into helical coils in like manner. Typically, the extruded size of the coils is selected to produce, after full densification, helical coils about 3–17 mm in inner diameter and of a length suitable for a resonant frequency of about 100 MHz to about 1.5 GHz.

The extruded coils are embedded in a setter powder, e.g. of a like superconducting material, e.g. a YBCO powder to support a YBCO/binder extruded coil, to support their structural integrity during the binder removal process. Preferably, the particle size of the setter powder is larger than that of the powder used for coils' fabrication, to provide an adequate wicking mechanism for binder removal from the coil. The larger setter powder particle size reduces the capillary force created in the early stages of the binder removal process and retards the binder removal rate, preventing crack formation. A typical average particle size for a YBCO setter powder is about 20 μm for a coil fabricated from 2 μm YBCO powder, a 10:1 ratio, although ratios of 5:1 to 15:1 or greater may also be used. (A 20 μm YBCO powder is available from Superconductive Components Inc, Columbus, Ohio 43212.)

The binder removal process is carried out at a temperature of about 450°–650° C., typically about 550° C., and provides structural rigidity in the resulting green coil sample. As used herein, the term "green" is intended to indicate a coil in the binder-removed, unsintered state; that is of sufficient firmness after binder removal to maintain its shape during subsequent handling and sintering. The heating rate is preferably sufficiently slow to aid in maintaining the dimensional precision of the coil. Typical heating rates for the binder removal process are 1°–2° C./min for coils with 3.2 mm I.D. and about 0°–5° C./min for coils with I.D.'s larger than 5.0 mm. In a preferred process, after the binder is removed any setter powder adhered to the surface of the green coil is removed. Typically, this is performed by sonicating the green coil in a non-reactive liquid, e.g. an absolute ethanol bath, until a smooth coil surface is achieved. The green coil may then be annealed in oxygen, e.g. at about 500°–550° C., typically at about 520° C., to remove any residual carbonaceous species, for at least 2 hr, typically for about 5–15 hr.

The binder-removed green coil is sintered in an oxidizing atmosphere, e.g. in air, heating and cooling at a slow heating rate, then annealed in oxygen for a time sufficient to complete the phase transformation from non-superconducting to a superconducting phase. Typical heating rates for the sintering of the coils are about 2°–3° C./min; a typical cooling rate is about 2° C./min. For example, a YBCO coil may be heated in air at a 3° C./min heating rate to 930° C. for 30 to 60 min, then cooled at a 2° C./min cooling rate to an annealing temperature of about 450°–550° C. The sintered YBCO coils may then be annealed in oxygen at this temperature for 48 hr to convert the tetragonal phase to the superconducting orthorhombic phase, $YBa_2Cu_3O_{7-x}$. These resulting coils have a $T_c$ of 90K and a density of at least about 93%, preferably at least about 95%, most preferably about 98%, of theoretical density (based on 6.38 g/cm$^3$). Optionally, the sintered, annealed coils may be bromine etched and reannealed to further improve the quality factor.

The above described process results in a straight, smooth coil with a regular configuration (even pitch). The microstructure of the coil is dense with elongated grains. The Q value of a helical resonator made of a typical YBCO coil produced by this process is a factor of five higher than its copper counterpart at a resonance frequency of 1.06 GHz and 77K.

Each step in the process described above needs to be carefully controlled to achieve optimal microwave properties. Extensive processing studies have shown that surface roughness, deformation of the coil, the presence of secondary phases, and porosity at the coil surface have deleterious effects on the performance of the resonator. Although the critical current density of these coils is relatively high, this does not seem to be a controlling factor in the resonator performance.

Alternatively, the coil may be textured after sintering. For example, the coil may first be sintered below about 1010° C. to consolidate or densify its microstructure and eliminate porosity. The consolidated coil then is textured by holding at a temperature above about 980° C. for a time sufficient to align the grains along the current carrying plane, and slow cooling at about 1°–2° C./min.

Also alternatively, the helical coils may be textured by heating the green coils to at least the incongruent melting temperature (about 980°–1050° C., typically about 1010° C., for YBCO), and holding at that temperature for a brief period (e.g. for about 1–10 min). Then the material is slow cooled at no more than about 1° C./min, e.g. about 6° C./hr, to about 980° C. and held for a short time (e.g. about 10 min) to begin directional solidification, e.g. recrystallization.

In another alternative method, the coils may be textured by doping the superconductor powder/binder mixture with at least about 3 w/o textured superconducting grains, i.e. grain aligned clusters of a like copper oxide based superconductor, before extruding, binder removal, and sintering. This texturing method is described in more detail in above-referenced application Ser. No. 07/745,819. It appears that the high shear stresses induced during subsequent extrusion of the seeded (doped) samples provide sufficient uniformity of alignment direction of the aligned clusters to permit the grain-alignment process to occur during holding at lower temperatures than the above-described incongruent melting temperatures. Also, since the seeding initiates alignment of grains throughout the length of the sample, the degree of alignment is not influenced by the sample length. A typical sintering schedule for binder-removed, seeded samples of Y-B-C-O coils is (1) heating at about 5° C./min to 1010° C. and holding at that temperature for 1 min; (2) cooling at 0.04° C./min to 950° C. and holding at that temperature for ½ hr; (3) cooling at about 2° C./min to 500° C. and holding at that temperature for at least 24 hr; and (4) cooling at about 2° C./min to ambient; all in an oxidizing atmosphere.

The slow heating and slow cooling rates not specified for these methods are within the same ranges as those described above. By any of these texturing methods, sintered coils are produced having elongated grains aligned along the wire axis. The textured coil is then annealed in oxygen at about 450°–550° C., transforming the material, e.g. tetragonal RE-B-C-O phase, to the superconducting phase, e.g. the orthorhombic phase.

The binder removal, sintering, and texturing steps may be carried out in air or oxygen; the annealing step preferably in oxygen. The heating process may be a continuous process, adjusting the temperature and atmosphere for the different heating steps. Optionally, the heating process may be interrupted after the binder removal step, and/or after the sintering step. That is, at either or both of these points the coil may be cooled to room temperature in the oxidizing atmosphere then reheated to the required temperature to perform the next processing step.

Figure 3:
FIG. 3 is a photomicrograph showing the dense microstructure of a highly dense coil of FIG. 1.

A typical coil fabricated by the method described herein, shown in FIG. 1 as mentioned above, is a straight, smooth coil with a regular configuration (even pitch). FIG. 3 is an SEM micrograph showing the microstructure of one of the coils of FIG. 1 having a density of 98% of theoretical density, with elongated grains of 10 $\mu$m in length and 2.5 $\mu$m in width.

Microwave characterization of the coils fabricated as described herein may be performed by inserting the sintered and annealed coil into the cylindrical cavity of a helical resonator structure, e.g. of copper, of appropriate size. The helical coil is open-circuited on both ends, and is mounted in the cavity by supporting the ends of the helix using two insulating, e.g. Teflon, seats within the cavity to form a half wave resonator.

Figure 4:
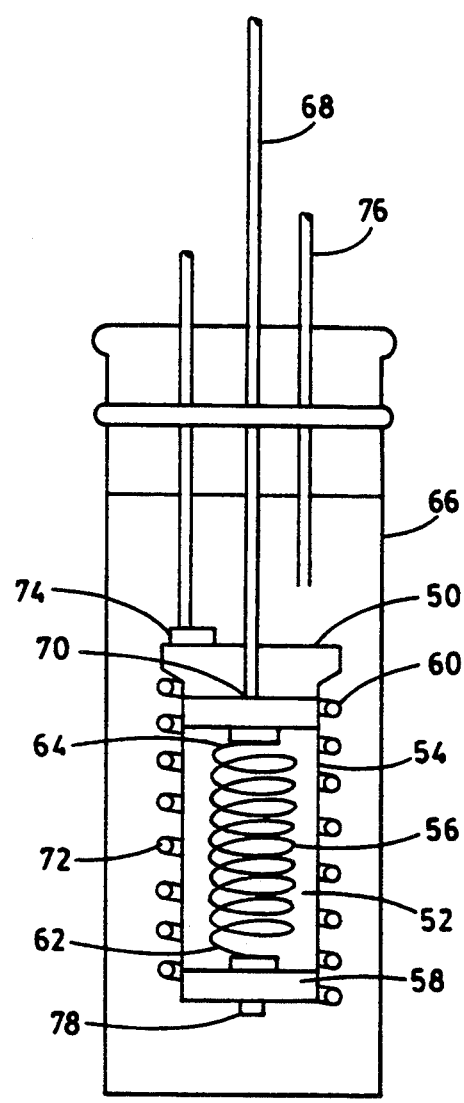
FIG. 4 is a schematic elevational view of a typical helical resonator including a helical coil fabricated by a process in accordance with one embodiment of the invention.

A typical half wave resonator for testing such coils is shown in FIG. 4, in which half wave resonator 50 includes cavity 52 defined by copper cavity enclosure 54, in which helical resonator coil 56 is supported by lower Teflon seat 58 and upper Teflon seat 60 at respective lower end 62 and upper end 64 of coil 56. Coil ends 62 and 64 are open circuited. Cavity enclosure 54 is enclosed in copper outer jacket 66, and suspended therein using semi-rigid coaxial cable 68, which creates an electric field within cavity 52 by being electrically coupled to field probe 70. Heating means 72 surrounds cavity enclosure 54, while the temperature within cavity 52 is measured by silicon diode sensor 74. Port 76 in jacket 66 and aperture 78 in cavity enclosure 54 permit flushing, evacuation, and/or back-filling of cavity 52 and the interior of jacket 66.

In operation, jacket 66 is suspended in liquid nitrogen or liquid helium to cool cavity 52 and coil 56 to superconducting temperature, and heating means 72 is used to adjust the temperature of cavity 52 and coil 54 upward to the desired operating temperature. An electric field is then created within cavity 52 via coaxial cable 68 and field probe 70. By adjusting the applied electrical power to a resonant frequency of the coil, the quality factor, Q, of the coil at various temperatures between 77K and 4.2K may be measured. For each resonance of the coil, Q can be calculated by known methods, for example by the impedance method described by E. L. Ginzton ("Microwave Measurements", Ch. 9, McGraw-Hill Book Co., Inc., N.Y., 1957), incorporated herein by reference.

The following Examples are presented to enable those skilled in the art to more clearly understand and practice the present invention. These Examples should not be considered as a limitation upon the scope of the present invention, but merely as being illustrative and representative thereof.

EXAMPLES 1–3

An ester wax binder, as described above, in an amount of 0.845 g was melted in a beaker at about 100° C. While stirring with a rod to ensure homogeneous mixing, about 10 g of superconducting $YBa_2Cu_3O_{7-x}$ powder of average diameter 2 $\mu$m was slowly added to the molten wax. The mixture was stirred for about 20 min, allowed to cool in a mortar, and crushed into small chunks in the same mortar. The amount of wax binder used was selected to produce a solids fraction of YBCO powder in the mixture of 91.0–91.5 weight % or 61.0–63.0 volume %, as characterized by TGA.

Extruded helical coils with various wire diameters and various I.D.'s and lengths were formed using the extrusion system described above, having a pneumatic syringe, a speed-controlled rotating mandrel with a mandrel diameter selected to give the desired coil I.D., and a speed-controlled transversal platform. By coordinating the extrusion rate, the diameter and rotational speed of the mandrel and the transversal speed of the platform, coils of the desired dimensions were fabricated. The speed settings and other fabrication data are shown in Table I. The syringe was filled and tapped to settle the mixture, the pumping cap was placed in the syringe and manually pushed into close contact with the mixture, and the syringe was placed in a heat jacket. The syringe was pumped at the set pneumatic pressure until all of the air was expelled, periodically manually pushing the pumping cap down to contact the mixture and rotating the syringe in the heat jacket. When the mixture had reached the desired temperature throughout its volume, a constant extrusion rate was established and the extruded wire was allowed to wrap about the rotating, translating mandrel.

TABLE I

| Example | Extruding Temp., °C. | Extruding Pressure, psi | Mandrel OD, mm | Rotational Speed, rpm | Trasversal Speed, in/min |
| --- | --- | --- | --- | --- | --- |
| 1 | 110 | 90 | 3.8 | 34.8 | 1.9 |
| 2 | 110 | 98 | 5.2 | 33.0 | 1.8 |
| 3 | 104 | 90 | 8.7 | 18.6 | 2.25 |

The extruded coils were imbedded in a 20 μm $YBa_2Cu_3O_{7-x}$ setter powder to support their structural integrity during the binder removal process. The average particle size of the setter powder was about 20 μm, larger than the 2 μm size powder used to fabricate the coil. The binder removal process was carried out at 650° C. in order to provide structural rigidity of the resulting sample. The heating rate to reach this temperature was 1.0°-2.0° C./min for coils with 3.2 mm I.D., and was 0.5° C./min for coils with I.D.'s larger than 5.0 mm. After the binder was removed, the resulting green coil was then sonicated in an absolute ethanol bath to remove some of the stuck setter powder to achieve a smooth surface. An oxygen anneal was then performed at 520° C. to remove residual carbonaceous species.

The binder-removed green coils were suspended horizontally along their axial length by threading them on alumina rods with an outside diameter no greater than 30% of the inside diameter of the coils to allow for shrinkage of the coils. The coils were then sintered in air, using a 3° C./min heating rate to reach 930° C., and holding at that temperature for 30 to 60 min. The coils were cooled at a 2° C./min rate to 500° C., and the sintered coils were oxygenated (oxygen annealed) at this temperature for 48 hr to complete the phase transformation from tetragonal to orthorhombic phase, $YBa_2Cu_3O_{7-x}$.

The dimensions of the coils for resonance frequencies near 1 GHz are listed below in Table II. The resulting coils had a $T_c$ of 90K and a density of about 95% of theoretical density (based on 6.38 g/cm³) or higher. The Q value of the helical resonator made of the YBCO coils of these Examples is a factor of five higher than their copper counterpart at a resonance frequency of about 1 GHz at 77K.

TABLE II

| | Coil Dimensions | | | | |
| --- | --- | --- | --- | --- | --- |
| Example | Length, cm | ID, mm | Wire Size, mm | No. Turns | Pitch, mm |
| 1 | 1.2 | 3.18 | 0.6 | 10.5 | 0.6 |
| 2 | 1.46 | 4.6 | 0.6 | 12 | 0.6 |
| 3 | 2.5 | 6.3 | 2 | 6.5 | 2 |

EXAMPLES 4–6

Further coil samples were fabricated similarly to those described for Examples 1–3. Mixtures of 44 g of powder and 3.85 g binder were extruded at 100° C., 90 psi from a larger capacity syringe than that used for Examples 1–3. The binder burnout was performed by raising the temperature to a 580° C. in 20 hr, holding at that temperature for 6 hr, then cooling to ambient in 8 hr. The burned-out coils were annealed in flowing oxygen at 530° C. furnace setting for 15 hr. The TGA showed 91.8% solids. The coils were sintered in oxygen, heating to 450° C. at 3° C. min, held at 450° C. for 2 hr, heated to 930° C., held for 1 hr at 930° C., cooled to 500° C. at 2° C./min, held at 500° C. for 36 hr in flowing oxygen, then cooled to ambient. The coil dimensions are shown in Table III. The coils were even and smooth, had a $T_c$ of 90K, and very high Q values compared to copper.

TABLE III

| | Coil Dimensions | | | | | Resonance |
| --- | --- | --- | --- | --- | --- | --- |
| Example | Length, cm | ID, mm | Wire Size, mm | No. Turns | Pitch, mm | Frequency MHz (approx.) |
| 4 | 3.2 | 17 | 1.8 | 13+ | 2.5 | 186 |
| 5 | 2.0 | 17 | 0.8 | 4+ | 2.5 | 457 |
| 6 | 6.5 | 17 | 0.8 | 28+ | 2.0 (approx.) | 100 |

The process described herein uses a one-step shaping process to produce superconducting helical coils of precise dimensions by plastic extrusion. By this process, larger quantities of superconducting helical coils of high microwave quality, Q, may be produced than by prior art processes. The critical temperature, $T_c$, at which zero resistance occurs in these superconducting coils is high, e.g. about 90K for an $YBa_2Cu_3O_{7-x}$ (YBCO) coil having a density of 95% of theoretical density (based on a theoretical density for YBCO of 6.38 g/cm³). The Q value of the helical resonators made of these coils is higher than that of their copper counterparts, e.g. for a typical YBCO coil at 77K, by a factor of at least five at resonance frequencies near 1 GHz (i.e. about 800 MHz–1.2 GHz). The surface resistance, $R_s$, of the best YBCO coil fabricated by the process described herein was ⅛th that of a similar copper coil.

While there has been shown and described what are at present considered the preferred embodiments of the invention, it will be obvious to those skilled in the art that various changes and modifications can be made therein without departing from the scope of the invention as defined by the appended claims.

We claim:

1. A method for producing a superconducting copper oxide based helical resonator coil comprising the steps of:

mixing a copper oxide based superconductor as a powder and a binder as a melt at a solids loading of about 45–65% by volume to form a homogeneous extrudable powder/binder mixture, wherein said binder consists essentially of an ester wax with no more than about 0.25 weight percent extrusion-aiding additives, and said ester wax has the general formula RCOOR' with said R and said R' each being independently selected from the group consisting of long chain hydrocarbon groups of at least 6 carbons, and said ester wax has a melting point of about 40°–100° C. and a viscosity of about 94–2000 centipoise at its melting point;

extruding said binder/powder mixture to form an as-extruded wire about 800 μm to about 2 mm in diameter;

simultaneously with said extruding step, wrapping said as-extruded wire around a cylindrical mandrel to form an extruded helical coil;

removing said extruded coil from said mandrel;

heating said extruded coil, while said extruded coil is embedded in a setter powder, in an oxidizing atmosphere at a heating rate of up to about 2° C./min to a binder removal temperature of about 450°–650° C., and holding said extruded coil in said oxidizing atmosphere at said binder removal temperature for a time sufficient to remove said binder from said extruded coil and to form a green coil having a density of at least 50% of theoretical density, wherein said setter powder is selected to avoid contamination of said green coil;

heating said green coil in said oxidizing atmosphere at a heating rate of up to about 3° C./min to about the incongruent melting temperature of said superconductor, and holding said green coil in said oxidizing atmosphere at about said incongruent melting temperature for a time just sufficient to begin partial melting of at least one component in said superconductor; and cooling said partially melted coil in said oxidizing atmosphere at a rate below about 4° C./min to a consolidation temperature of about 940°–969° C., and holding said coil in said oxidizing atmosphere at said consolidation temperature for a time sufficient to consolidate said coil to a density of at least 90% of theoretical density and sufficient to achieve an average grain length of at least about 0.3 mm and grain alignment along the length of said wire;

cooling said densified coil in said oxidizing atmosphere at a rate below about 2° C./min to a cooled temperature at or below about 550° C.; and holding said cooled coil at an annealing temperature of about 450°–550° C. in an atmosphere of flowing oxygen for a time sufficient to convert the crystal structure of said cooled coil to at least 50 v/o high $T_c$ phase superconducting perovskite crystal;

wherein said extruded helical coil produced by said extruding and wrapping steps is of a geometry selected to produce, after subsequent densification, a helical resonator coil about 3–17 mm in inner diameter, of a total length n λ/2, wherein n is an integer and λ is the operating wavelength of said helical resonator coil.

2. A method in accordance with claim 1 further comprising the step, after said step of heating said extruded coil to remove said binder, of sonicating said green coil in a non-reactant liquid for a time sufficient to produce a smooth surface on said green coil.

3. A method in accordance with claim 1 further comprising the step, before said step of heating said green coil to about said incongruent melting temperature, of holding said green coil at an annealing temperature of about 450°–550° C. in an atmosphere of flowing oxygen for at least 2 hr.

4. A method in accordance with claim 1 wherein said mixture further comprises at least about 3 w/o grain-aligned clusters of a like copper oxide based superconductor.

5. A method in accordance with claim 1 wherein said copper oxide based superconductor is a bismuth containing copper oxide superconductor.

6. A method in accordance with claim 5 wherein said bismuth containing copper oxide superconductor is selected from the group consisting of a bismuth strontium calcium copper oxide superconductor and a bismuth lead strontium calcium copper oxide superconductor.

7. A method in accordance with claim 1 wherein said copper oxide based superconductor is a rare earth barium copper oxide superconductor.

8. A method in accordance with claim 1 wherein said copper oxide based superconductor is an yttrium barium copper oxide superconductor and said incongruent melting temperature is about 980°–1050° C.

9. A method in accordance with claim 1 wherein said setter powder is a like copper oxide based superconductor.

10. A method in accordance with claim 1 wherein said setter powder has an average particle diameter about 5–15 times larger than that of said superconductor powder.

11. A method for producing a superconducting rare earth barium copper oxide based helical resonator coil comprising the steps of:

mixing a rare earth barium copper oxide superconductor as a powder and a binder as a melt at a solids loading of about 45°–65% by volume to form a homogeneous extrudable powder/binder mixture, wherein said binder consists essentially of an ester wax with no more than about 0.25 weight percent extrusion-aiding additives, and said ester was has the general formula RCOOR' with said R and said R' each being independently selected from the group consisting of long chain hydrocarbon groups of at least 6 carbons, and said ester wax has a melting point of about 40°–100° C. and a viscosity of about 94–2000 centipoise at its melting point;

extruding said binder/power mixture to form an as-extruded wire;

simultaneously with said extruding step, wrapping said as-extruded wire around a cylindrical mandrel to form an extruded helical coil;

removing said extruded coil from said mandrel;

heating said extruded coil, while said extruded coil is embedded in a setter powder, in an oxidizing atmosphere at a heating rate of up to about 2° C./min to a binder removal temperature of about 450°–650° C., and holding said extruded coil in said oxidizing atmosphere at said binder removal temperature for a time sufficient to remove said binder from said extruded coil and to form a green coil having a density of at least 50% of theoretical density, wherein said setter powder is selected to avoid contamination of said green coil;

heating said green coil in said oxidizing atmosphere at a heating rate of up to about 3° C./min to about the incongruent melting temperature of said superconductor, and holding said green coil in said oxidizing atmosphere at about said incongruent melting temperature for a time just sufficient to begin partial melting of at least one component in said superconductor; and cooling said partially melted coil in said oxidizing atmosphere at a rate below about 4° C./min to a consolidation temperature of about 940°–969° C., and holding said coil in said oxidizing atmosphere at said consolidation temperature for a time sufficient to consolidate said coil to a density of at least 90% of theoretical density and sufficient to achieve an average grain length of at least about 0.3 mm and grain alignment along the length of said wire;

cooling said densified coil in said oxidizing atmosphere at a rate below about 2° C./min to a cooled temperature at or below about 550° C.; and holding said cooled coil at an annealing temperature of about 450°–550° C. in an atmosphere of flowing oxygen for a time sufficient to convert the crystal structure of said cooled coil to at least 50 v/o high $T_c$ phase superconducting perovskite crystal;

wherein said extruded helical coil produced by said extruding and wrapping steps is of a geometry selected to produce, after subsequent densification, a helical resonator coil about 3–17 mm in inner diameter, and of a total length n $\lambda/2$, wherein n is an integer and $\lambda$ is the operating wavelength of said helical resonator coil, said length being suitable for a resonant frequency of about 100 MHz–1.5 GHz.

12. A method in accordance with claim 11 further comprising the step, after said step of heating said extruded coil to remove said binder, of sonicating said green coil in a non-reactant liquid for a time sufficient to produce a smooth surface on said green coil.

13. A method in accordance with claim 11 further comprising the step, before said step of heating said green coil to about said incongruent melting temperature, of holding said green coil at an annealing temperature of about 450°–550° C. in an atmosphere of flowing oxygen for at least 2 hr.

14. A method in accordance with claim 11 wherein said mixture further comprises at least about 3 w/o grain aligned clusters of a like rare earth barium copper oxide superconductor.

15. A method in accordance with claim 11 wherein said rare earth barium copper oxide superconductor is an yttrium barium copper oxide superconductor.

16. A method in accordance with claim 15 wherein said setter powder is an yttrium barium copper oxide superconductor having an average particle diameter about 5–15 times larger than that of said yttrium barium copper oxide superconductor powder.

17. A method in accordance with claim 15 wherein said mixture further comprises at least about 3 w/o grain aligned clusters of an yttrium barium copper oxide superconductor.

18. A method in accordance with claim 11 wherein said rare earth barium copper oxide superconductor is an yttrium barium copper oxide superconductor and said incongruent melting temperature is about 980°–1050° C.

* * * * *